United States Patent [19]
Carlson

[11] Patent Number: 4,755,755
[45] Date of Patent: Jul. 5, 1988

[54] COMPACT TRANSVERSE MAGNETIC GRADIENT COILS AND DIMENSIONING METHOD THEREFOR

[75] Inventor: Joseph W. Carlson, San Francisco, Calif.

[73] Assignee: The Regents of the University of California, Berkeley, Calif.

[21] Appl. No.: 19,631

[22] Filed: Feb. 27, 1987

[51] Int. Cl.$^4$ ............................................. G01R 33/20
[52] U.S. Cl. ................................................... 324/319
[58] Field of Search ............... 324/307, 309, 318, 322, 324/319, 320; 335/299; 336/225

[56] References Cited

U.S. PATENT DOCUMENTS

| | | | |
|---|---|---|---|
| 3,569,823 | 10/1971 | Golay | 324/320 |
| 3,622,869 | 7/1971 | Golay | 324/320 |
| 4,475,084 | 10/1984 | Moore et al. | 324/309 |
| 4,486,711 | 12/1984 | Frese et al. | 324/320 |

OTHER PUBLICATIONS

"Magnetic Field Profiling: Analysis and Correcting Coil Design: by F. Romeo and D. I. Hoult, Mag. Res. in Medicine, 1, 44–65 (1984).

*Primary Examiner*—Stewart J. Levy
*Assistant Examiner*—Kevin D. O'Shea
*Attorney, Agent, or Firm*—Nixon & Vanderhye

[57] ABSTRACT

The axial dimensions of the usual "saddle" coils used to create transverse magnetic gradients in the static magnetic field of a magnetic resonance imaging system are substantially foreshortened. The outer arc of the saddle coil is moved axially inward while still leaving it at a position which produces negligible net transverse gradient contribution. While this new position of the outer arc can be expected to produce a significant second (third) derivative of the transverse gradient with respect to Z (the orientation of the static magnetic field) at the predetermined observation point, the inner arc of the saddle coil may be moved slightly away from the observation point so as to produce a second (third) derivative which substantially cancels that of the relocated outer arc. In this manner, the desired condition of having a net zero second (third) derivative may still be maintained even though the axial dimension of the saddle coil has been substantially reduced (e.g., to about 44% of the traditional axial length in one exemplary embodiment). Such a more compact coil may permit realization of lowered inductance (and thus permit faster gradient switching during MRI procedures) or, additional coil turns may be employed while still retaining the same inductance but thus permitting the regeneration of larger gradients or, the use of lower currents (thereby saving on power amplifiers, power dissipation, etc.).

12 Claims, 4 Drawing Sheets

COMPACT TRANSVERSE MAGNETIC GRADIENT COILS AND DIMENSIONING METHOD THEREFOR

This invention relates generally to the art of magnetic resonance imaging (MRI) utilizing nuclear magnetic resonance (NMR) phenomena. It is more particularly directed to the electromagnetic coil structure used in an MRI system for creating transverse magnetic gradients in a static magnetic field directed along a predetermined z-axis. The invention also relates to a method for dimensioning such a transverse magnetic gradient coil in a particularly compact manner.

Magnetic resonance imaging systems are now commercially available from a number of sources. There are, in general, several techniques known to those in the art. Some exemplary techniques are set forth, for example, in commonly assigned issued U.S. Pat Nos. 4,297,637; 4,318,043; 4,471,305 and 4,599,565. The content of these issued patents is hereby incorporated by reference.

In most such MRI systems, a static magnetic field (e.g., created by a super conducting solenoid maintained in a cryogenic housing) is directed along a predetermined z-axis. In one exemplary embodiment, the static field may have a nominal field strength of approximately 3.5 KG thus making hydrogen nuclei exhibit NMR at approximately 15 MHz frequency. The usual mutually orthogonal x,y,z coordinate system is assumed and auxiliary x,y,z gradient coils are disposed within the static magnetic field so as to generate gradients therein along the x,y and z directions, respectively, when appropriate driving currents are passed therethrough. As will be appreciated, the x and y gradient coils each give rise to so-called transverse gradients (i.e., gradients in the static magnetic field along directions orthogonal to the z-axis direction of that field) and, typically, the x and y transverse gradient coil structures are substantially identical except for a 90° rotation with respect to each other.

In many MRI techniques, it is necessary to rapidly switch on/off (and sometimes to different precisely predetermined amplitudes) currents passing through these various gradient coils. Accordingly, the rapidity with which such switching operations can be achieved may constitute one determining factor in the overall speed of an entire imaging sequence. Since permissible coil switching speed is primarily a function of coil inductance, it follows that if one can somehow reduce the self-inductance of the transverse gradient coils, then faster magnetic gradient switching sequences may be realized.

It is also typically necessary to pass many amperes of current through many turns of the gradient coils to achieve the required gradient magnitude. Accordingly, a considerable cost is involved in providing sufficient current drive sources (e.g., power amplifiers and power switches, etc., capable of handling the required current levels) as well as in dissipation of $I^2R$ losses in the coil and associated driving circuitry. Accordingly, design techniques which tend to reduce the required gradient coil drive currents (for given gradient levels) are highly desirable.

Furthermore, if one could somehow provide additional gradient coil turns without increasing inductance, then similar switching times and current levels could be used to achieve higher magnetic gradient levels, should that be desired for some particular imaging purpose.

Some prior approaches to magnetic coil design for NMR devices may be found at:
U.S. Pat. No. 3,569,823—Golay (1971)
U.S. Pat. No. 3,622,869—Golay (1971)
"Magnetic Field Profiling Analysis and Correcting Coil Design" by F. Romeo and D. I. Hoult, Mag. Res. in Medicine, 1, 44–65 (1984)

Both Golay references are directed to homogenizing coils for use in a non-imaging NMR device—and are thus of limited relevance. However, Golay '823 does recognize that, for his homogenizing purposes, the second derivative of a transverse gradient field (which is itself a derivative) from the windings of two saddle coils (albeit having full 180° arcs) should be forced to zero. Although the explanation is somewhat obscure, Golay's solution is to add a third superimposed coil in order to get an approximately zero net second (third) derivative. Nevertheless, Golay thus generally recognized that the position/dimensions of plural saddle coil arcs might be adjusted so as to produce a *net* zero second (third) derivative.

Romeo et al direct their attention to gradient coils used in an imaging NMR device—and is therefore more directly relevant. It is representative of the "traditional" (i.e., now widely employed) MRI gradient coil solution which, as will be explained more fully below, achieves a net zero second derivative by dimensioning only two saddle coils so as to cause *each* arc to produce a zero second (third) derivative. However, this traditional solution results in relatively large coils ($z/r=.389$ and 2.57 where r is the coil arc radius and z is the relative location of each arc along the z-axis)—having a corresponding relatively large self-inductance.

I have now discovered a compact transverse magnetic gradient coil structure (and a method for dimensioning same) which makes it possible to achieve the above-mentioned desirable design goals (either singly or in combination).

In particular, the traditional saddle coil structure used for creating transverse magnetic gradient fields in most MRI systems is typically designed so as to locate the inner and outer arcs of the saddle coils at positions along the z-axis which *each* produce a zero third derivative at a predetermined observation point. (The second derivative is automatically caused to be zero by keeping the coil structure symmetric because the z component of the coil field is an odd function of the transverse dimension thus causing all even derivatives to vanish.) If the radius of the coil structure is assumed to be r, then the inner arc is traditionally positioned along the z-axis at a point $z_1/r=0.389$ and the outer arc is positioned along the z-axis at a point $z_2/r=2.57$. Accordingly, the separation between the inner and outer arcs of each saddle coil structure is approximately equal to $2.18r$.

In this traditional MRI solution, I have noted that the contribution of the outer saddle coil arc to the gradient at the observation point is quite small (e.g., only about 2%). I have also noted that the inductance of the saddle coil structure is approximately proportional to its axial length dimension.

Accordingly, I propose that the outer arc of the saddle coil be moved substantially inward towards the observation point thus substantially decreasing the axial dimension of the saddle coil structure and, accordingly, its self-inductance. Indeed, there is a position of the saddle coil at $z_2/r=\sqrt{2}$ (approximately 1.4) where there is theoretically a net zero contribution to the transverse gradient from the outer arc. Although the outer arc could be moved inward some relatively short further distance while still making only a relatively small contribution to the gradient, the preferred positioning of the outer arc is at approximately $z_2 = 1.4r$ in the exemplary embodiment.

Although repositioning the outer arc of the saddle coil substantially closer to the observation point does not materially increase its net overall contribution to the transverse gradient, it does make its third derivative contribution substantially non-zero. However, the desired zero net third derivative condition can still be met by making the third derivative contribution of the inner arc of the saddle coil substantially equal and off-setting to that produced by the repositioned outer arc (and without necessarily adding any further compensating coil). Such a compensated repositioning of the inner arc requires but a relatively small movement of the inner arc away from the point of observation. In one exemplary embodiment, the inner arc is moved from the traditional MRI solution ($z_1 = 0.389r$) to a new position $z_1 \simeq .45r$. In this exemplary embodiment, the axial separation between the outer and inner arcs of the saddle coil is now only approximately $0.96r$—which represents approximately only 44% of the axial dimensions of the traditional MRI saddle coil structure.

Since the axial dimensions of the saddle coil structures may be reduced as much as approximately one-half, it follows that the inductance of a given number of turns will also be reduced by about one-half. This lessened inductance may be utilized to permit faster switching or, alternatively, additional turns may be employed so as to keep the same inductance (e.g., with approximately the same possible switching speeds) but requiring less current thus providing significant savings on power dissipation and maximum current handling capabilities required for power amplifiers, switches, etc. As will be appreciated, the improvements permitted by a more compact saddle coil structure also may be shared in some manner so as to permit somewhat faster switching while simultaneously using lesser required current values, etc.

These as well as other objects and advantages of this invention will be more completely understood and appreciated by carefully reading the following detailed description of a presently preferred exemplary embodiment of this invention when taken in conjunction with the accompanying drawings, of which:

Figure 1:
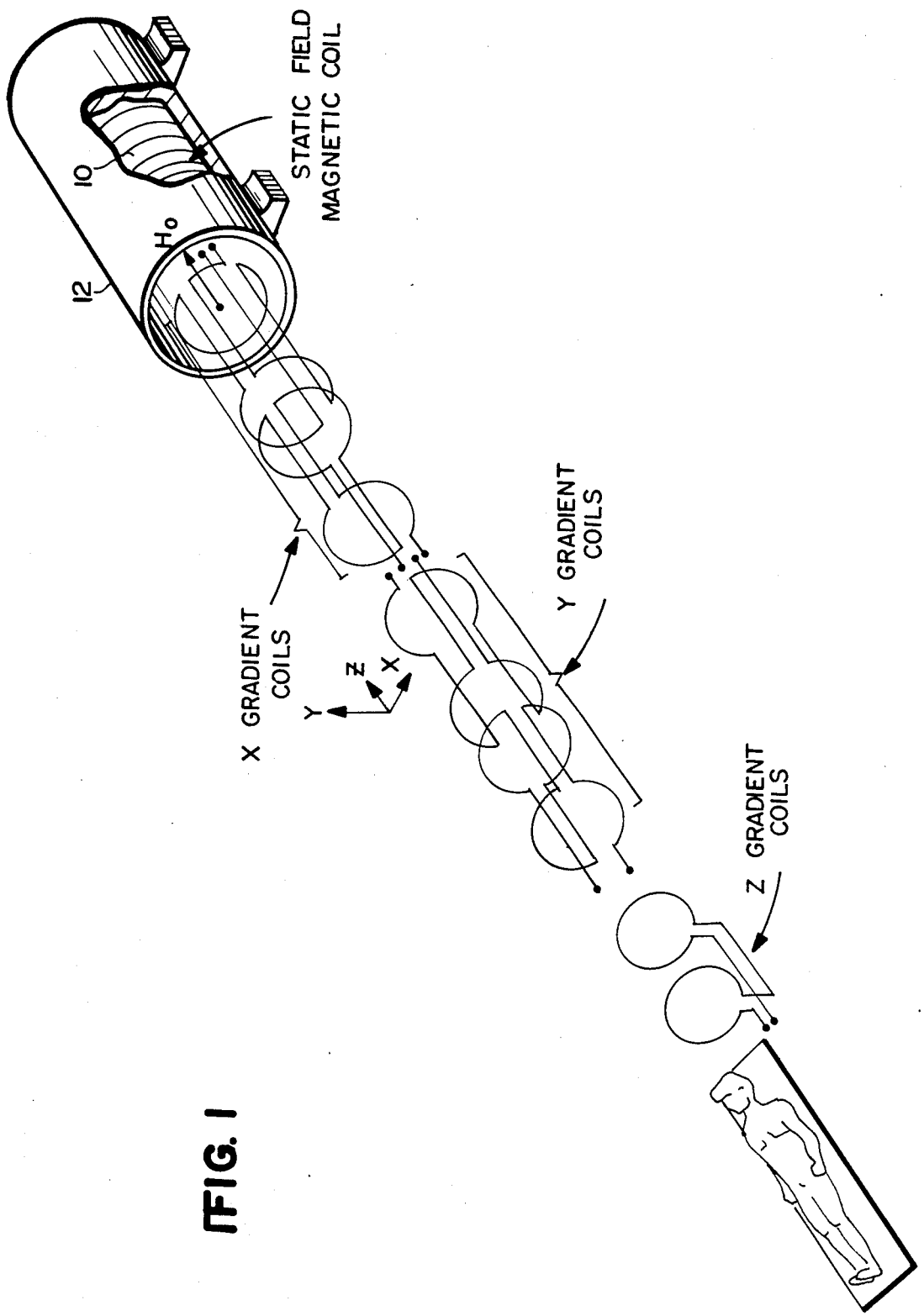
FIG. 1 is an exploded perspective view of a suitable static magnetic coil and gradient coils for use with an exemplary embodiment of this invention.

The general organization of magnetic field generating elements for a typical MRI system is shown in exploded format at FIG. 1. For example, a super conducting solenoid 10 in a cyrogenic housing 12 may be used to produce a strong static magnetic field $H_o$ directed along the z-axis in the usual x,y,z coordinate system (also depicted at FIG. 1). Nested within the static field coil 10 are the x-gradient coils, the y-gradient coils and the z-gradient coils for producing gradients in the static field $H_o$ along the x,y and z directions respectively. A patient or other object to be imaged typically is then positioned within all of these nested gradient coils with the portion of the body to be imaged located at some predetermined observation "point" or imaging volume (e.g., typically between the symmetrical saddle coil structures of the x and y gradient coils). As will be appreciated by those in the art, suitable r.f. coupling coils are also positioned within the gradient coils structures and connected by suitable transmission lines to r.f. and MRI processing circuits. The gradient coils also are individually connected to suitable switched current drivers controlled by the MRI apparatus in the usual manner.

As can be seen in FIG. 1, the x and y gradient coils are of substantially identical construction but are rotated by 90° with respect to one another so as to produce transverse gradient in the two mutually perpendicular x and y directions, respectively. The x-gradient coil is depicted in more detail at FIG. 2.

Figure 2:
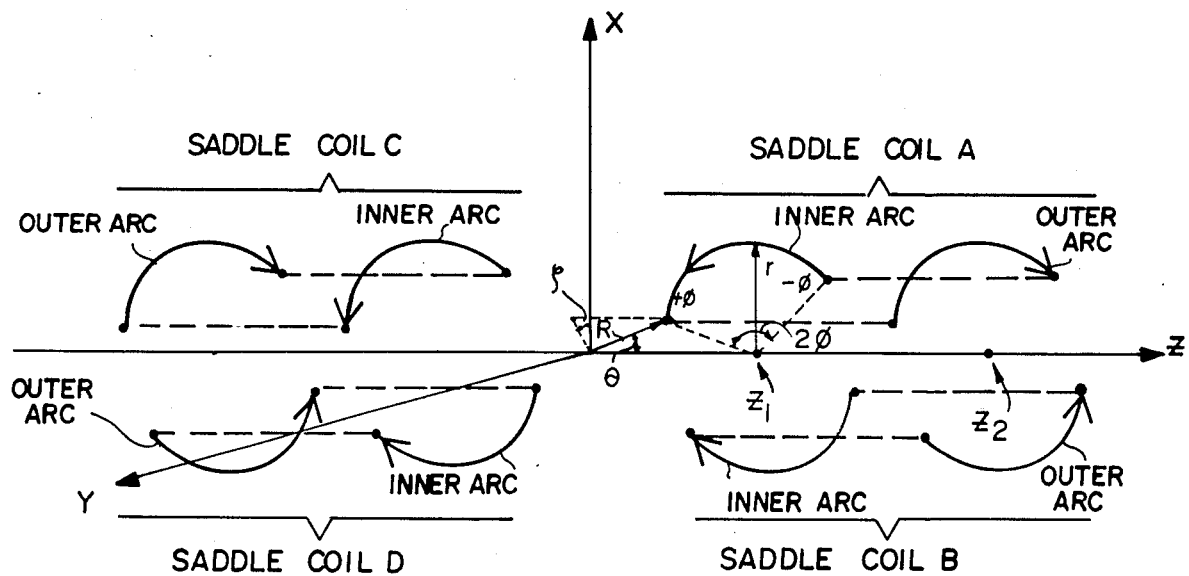
FIG. 2 is a more detailed depiction of the saddle coils used in one of the transverse gradient coil structures of FIG. 1 together with a depiction of the superimposed x,y,z and related polar coordinate systems useful in explaining this invention.

As shown in FIG. 2, a transverse gradient coil comprises symmetrically positioned "saddle" coils A, B, C and D (presumably so-called because they each somewhat resemble the structure of an equestrian saddle partly circumscribing a generally cylindrical structure). The arcuate partial turns of each saddle coil are shown in solid lines while horizontal interconnecting conductors (parallel to the z-axis and thus giving rise to no z-component field) are shown in dashed lines. In a typical installation there are plural turns (e.g., 10) around each individual saddle coil and pairs of the saddle coils (i.e., A,B and C,D) are then electrically connected in series as generally depicted in FIG. 1.

Saddle coils A and B have axially aligned partial turns (shown by solid lines in FIG. 2) which, together, define an inner arc structure and outer arc structure (as also indicated in FIG. 2). Symmetrically positioned on the opposite side along the z-axis are saddle coils C and D having similar inner and outer arcs. The observation point is assumed to be at the origin of the coordinate system shown in FIG. and actually comprises a three-dimensional imaging volume disposed between the saddle coils where there is substantial homogeneity in the magnetic gradient fields (e.g., see FIG. 3). In one exemplary embodiment, each of the saddle coil structures includes approximately 10 turns of 0.4 inch square cross-sectioned conductor (which may have a 0.2 inch diameter cavity therein). In one exemplary compacted embodiment of this invention, such number of turns may be increased to 12 (so as to produce somewhat increased gradient strength and thus permit the imaging of substantially thinner slices in x and y dimensions) while still also producing somewhat less overall coil inductance.

As depicted in FIG. 2, the axially aligned partial turns within each arc of saddle coils A,B have opposingly directed currents (as indicated by arrows) and are of generally circular arcuate shape having a radius r centered about the z-axis. Each of the arcuate partial turns subtends the angle $2\phi$ (parallel to the transverse x,y axis along which the transverse gradient is to be produced). From the predetermined observation point at the origin, a polar coordinate system R, $\theta$, $\xi$ may also be used to locate points along each of the arcuate opposingly directed partial turns. Since the straight line segments (dashed lines in FIG. 2) contribute no field in the z direction, they can be ignored so as to simplify the analysis problem. The z component of the field produced by the inner arc turns can be computed from the expression for the magnetic field as an incomplete elliptic integral as depicted below:

$$B_z = \frac{\mu_o I}{4\pi} \frac{1}{(R^2 + r^2)^{3/2}} \sum_{K=0}^{\infty} \frac{(2K+1)!!}{(2K)!!} \left[ \frac{2rR\sin\theta}{R^2 + r^2} \right]^K \times \{I_K r^2 - rR\sin\theta I_{K+1}\}$$ [Equation 1]

with $$I_k = \int_{-\phi}^{\phi} d\xi' \cos^K(\xi - \xi')$$ [Equation 2]

Since we are here concerned only with the transverse gradient, the linear terms (i.e., those proportional to $\sin\theta$) may be isolated to yield:

$$B_z^{(1)} = \frac{\mu_o I}{4\pi} \frac{1}{(R^2 + r^2)^{3/2}} \left\{ \left(\frac{3}{2}\right) \left[ \frac{2rR\sin\theta}{r^2 + R^2} \right] r^2 - rR\sin\theta \right\} \times 2\sin\theta \cos\phi$$ [Equation 3]

And since the rectangular coordinate x may be expressed in terms of polar coordinates as $R\sin\theta\cos\tau$, the linear gradient term (i.e., the first derivative with respect to x—which should, desirably, be a constant if a truly linear gradient is to be achieved) term can be directly expressed as:

$$G_x = \frac{\mu_o I}{4\pi} \frac{(2r\sin\phi)}{[r^2 + R^2]^{3/2}} \left[ \frac{3 r^2}{R^2 + r^2} - 1 \right]$$ [Equation 4]

which, if evaluated on the z-axis ($R=z_1$) yields:

$$G_x = \frac{\mu_o I}{4\pi} \frac{2r\sin\phi}{[r^2 + z_1^2]^{5/2}} (2r^2 - z_1^2)$$ [Equation 5]

Then, adding up the contributions for all of the outer and inner arcs for all of the saddle coils A-D of FIG. 2, one obtains.

$$G_x = \frac{\mu_o I}{\pi} (2r\sin\phi) \left[ \frac{2r^2 - z_1^2}{(r^2 + z_1^2)^{5/2}} - \frac{2r^2 - z_1^2}{(r^2 + z_2^2)^{5/2}} \right]$$ [Equation 6]

Now it is desirable to minimize the z dependence of the x gradient $G_x$. Accordingly, it is desirable to minimize the first and higher order derivatives (which, since $G_x$ is already a first order derivative, also may be considered as second and higher order derivatives):

$$\frac{\partial}{\partial z_1}(G_x) = \frac{\mu_o I}{\pi} (2r\sin\phi) \left[ \frac{3z_1^3 - 12 z_1 r^2}{(r^2 + z_1^2)^{7/2}} \right]$$ [Equation 7]

$$\frac{\partial^2}{\partial z_1^2}(G_x) = \frac{-3\mu_o I}{\pi} (2r\sin\phi) \left[ \frac{4r^4 + 4z_1^4 - 27 z_1^2 r^2}{(z_1^2 + r^2)^{9/2}} \right]$$ [Equation 8]

A similar elaboration of these calculations yields expressions for the second derivatives of $G_x$ in other directions:

$$\frac{\partial^2}{\partial x^2} G_x = \frac{-3}{4} \frac{\partial^2}{\partial z^2} G_x + a$$ [Equation 9]

$$\frac{\partial^2}{\partial y^2} G_x = \frac{-1}{4} \frac{\partial^2}{\partial z^2} G_x - a$$ [Equation 10]

$$a = \frac{\mu_o I}{4\pi} \left( \frac{r\sin 3\phi}{2} \right) \frac{20 r^4 - 15 r^2 z^2}{(z^2 + r^2)^{7/2}}$$ [Equation 11]

If the angle subtended by the arc is chosen to the 120°, then all three second derivatives of $G_x$ can be made to vanish simultaneously when $\partial^2/\partial z^2)G_x$ vanishes.

The first (really the second) derivative vanishes due to symmetry after the full set of saddle coils A-D is considered. Therefore, the second (really the third) derivative is the first non-trivial derivative. However, noticing that the second (third) derivative includes a quadratic polynomial in the numerator, one pair of solutions (i.e., making this second (third) derivative equal to zero) can be obtained by finding solutions to the quadratic polynomial:

$$(z/r)^2 = \frac{27 \pm \sqrt{(27)^2 - 64}}{8}$$ [Equation 12]

values of $z/r = 0.389$ or 2.57 thus cause the second (third) derivative to vanish and this is exactly the traditional solution for the transverse magnetic gradient saddle coil structure typically used heretofore (e.g., the traditional MRI solution when $z_1$ 0.389r and $z_2 = 2.57r$).

However, the actual value of the transverse gradient produced at the observation point by the outer arc of the saddle coils when placed at this relatively remote location ($z_2 = 2.57r$) is approximately $2.2 \times 10^{-2}$ times smaller than the gradient produced by the inner arc ($z_1 = 0.389r$). Accordingly, the outer arc of the saddle coils is placed at a considerable distance from the inner arc (thus causing a relatively high self-inductance) only to insure that a relatively insignificant contribution to the gradient (at the observation point) has no z dependence.

Figure 5:
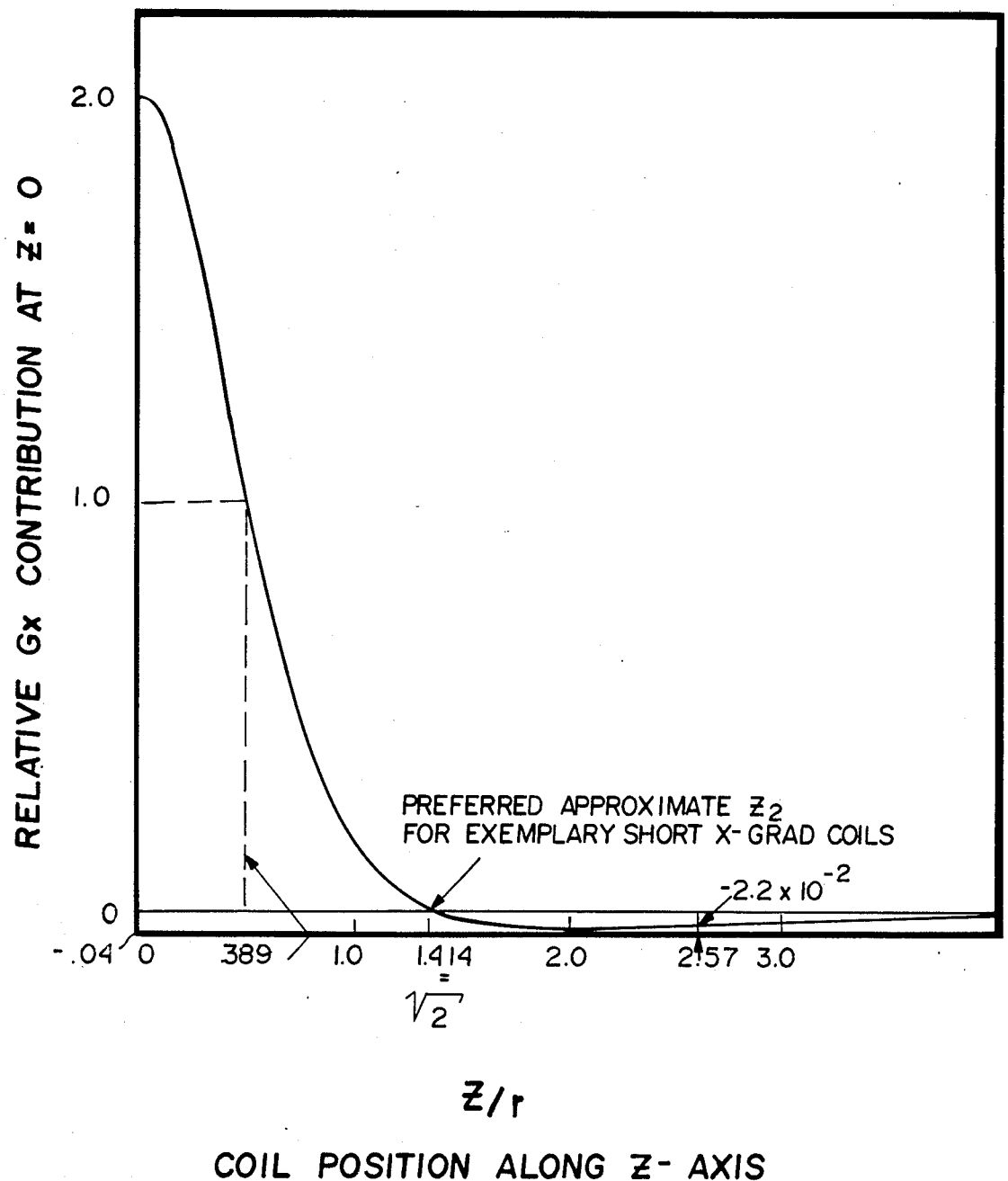
FIG. 5 is a plot of relative net transverse gradient contributions for a saddle coil arc as a function of arc position along the z-axis.

Reviewing a plot of the gradient contribution as a function of a coil arc position along the z-axis (FIG. 5), it will be observed that the outer arc may be moved substantially toward the observation point while still providing only a relatively insignificant contribution. Indeed, it may be moved to a position $z_2 = \sqrt{2}$ (i.e., about 1.4) where it theoretically has a zero net contribution to the gradient at the observation point (z=0).

Figure 4:
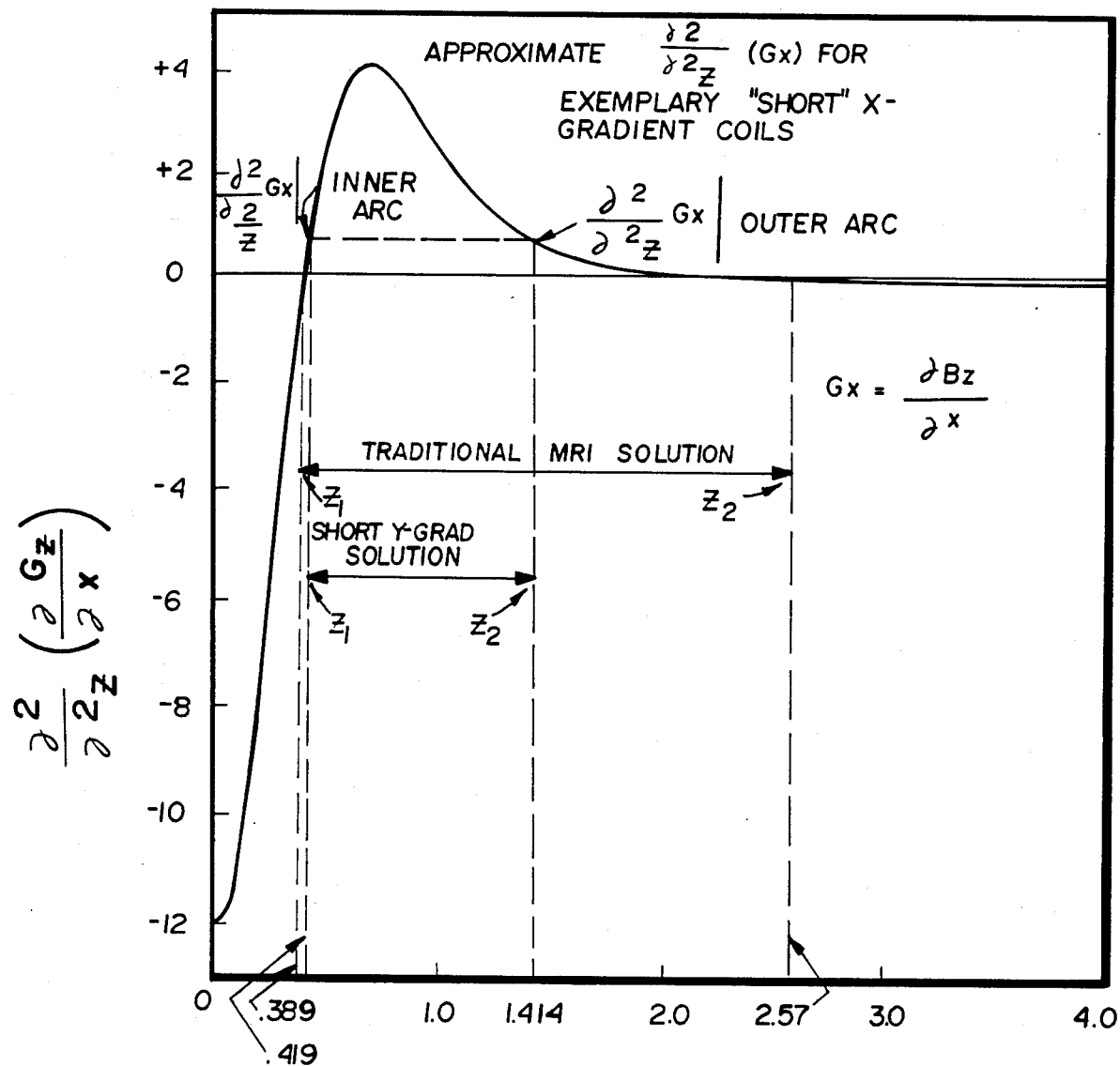
FIG. 4 is a plot of the approximate third derivative of $G_z$ at the observation point $z=0$ for different locations of saddle coil arcs.

Unfortunately, by moving the outer arc substantially toward the observation point, it now contributes a substantial second derivative contribution (as depicted in FIG. 4). However, it is now also possible to readjust the position of the inner arc (i.e., by moving it slightly *away* from the origin) so as to minimize the *total* second derivative of the x gradient $G_x$ with respect to z. (The second derivative of $G_x$ with respect to y continues to vanish when the x-gradient saddle coils subtend an arc of 120°.)

In the traditional MRI solution, *each* term of the second (third) derivative was caused to vanish separately. However, the desired lack of dependence upon z may still be achieved by relaxing the requirement somewhat and just requiring the *sum* of all the terms of second (third) derivative to vanish. Remembering that one such term continues to vanish if the saddle coils are symmetric and subtend 120°.) For example, Let $\alpha_1 = z_1/r$, $\alpha_2 = z_2/r$ [Equation 13]

then the results are:

$$G_x = \frac{\mu_0 I}{\pi r^2} (2 \sin \phi) \left[ \frac{2 - \alpha_1^2}{(1 + \alpha_1^2)^{5/2}} \right]$$ [Equation 14]

$\alpha_1 = 0.368$ [Equation 15]

Figure 3:
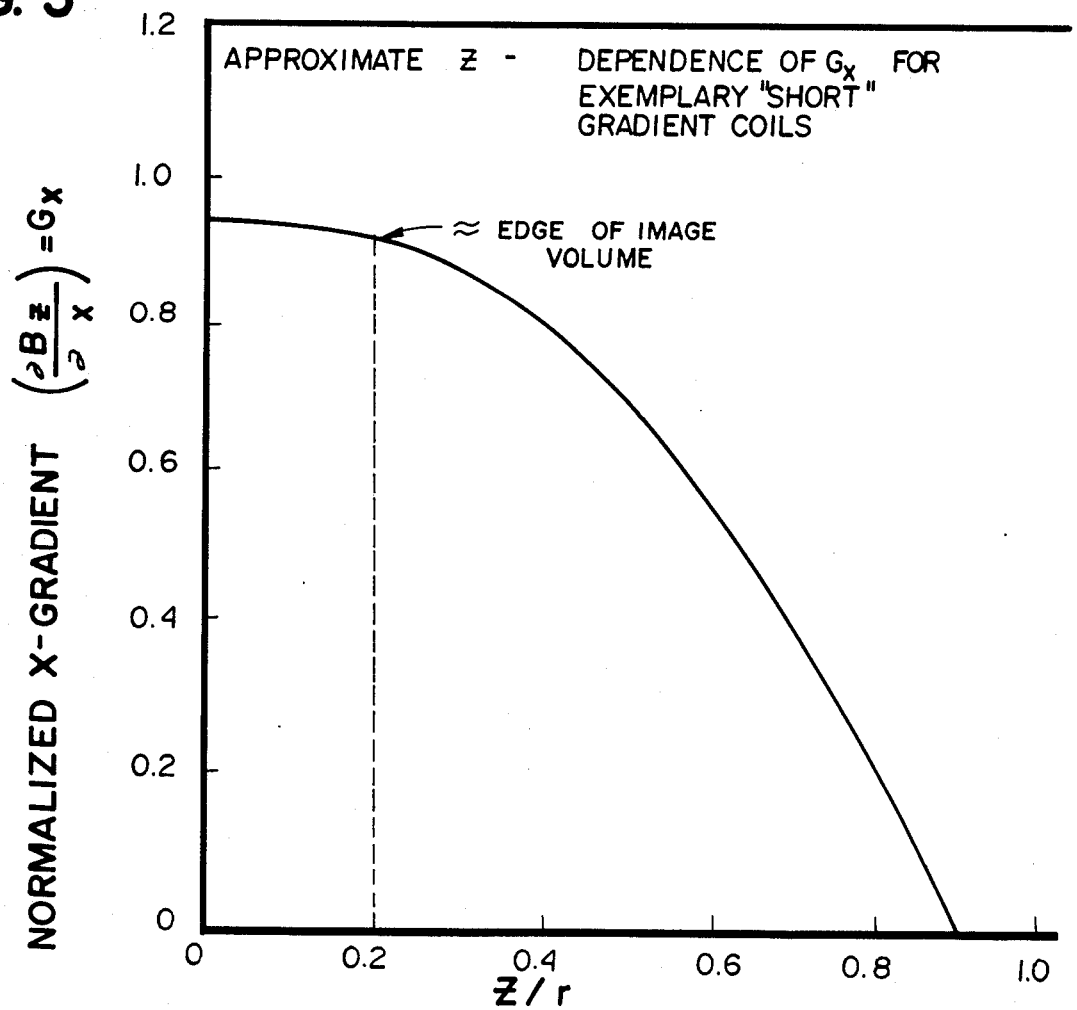
FIG. 3 is a plot of the approximate z dependence of a transverse gradient for an exemplary set of compact transverse gradient coils and depicting the approximate edge of an image volume permitted by such a structure.

$\alpha_2 = \sqrt{2} = 1.414$ [Equation 16]

for a small coil r=11.75 cm, $G_x = 0.9404/r^2$ Gauss/ampere-turns-cm and $G_x = 2.72$ Gauss/cm at 20 turns, 20 amps. The actual z dependence of the transverse gradient is depicted at FIG. 3.

Even for a larger coil, a relatively linear transverse gradient is obtained without substantial z-dependence (i.e., so as to provide relatively non-distorted MRI images) over an approximately 30 cm spherical imaging volume (typically the imaging volume actually utilized might comprise a series of thin planar "slices" extending as far as 10 cm in either direction from the "observation point." As little as +/−25ppm uniformity may be expected for the main static magnetic field. Within the acceptable imaging volume, the transverse gradient may vary +/− by only a few percent.

The choice of $z_2$=the $\sqrt{2}r$ is preferred. If the outer arc is moved a further amount towards the origin, then the image volume is shortened. If it is moved at some intermediate position (i.e., substantially less than 2.57r but still greater than 1.4r) then the image volume lengthens—but only at a relatively slow rate compared to the amount of axial movement of the outer arc. Therefore, positioning the outer arc at $z_2$=about 1.4r is preferred.

With 10 turns at 0.45 inch per turn, the wires on a transverse gradient coil can become quite large and heavy. It is therefore desirable to arrange the conductors so as to account for the finite width of each turn. The generalization of the compacted coil design previously described to one which accounts for finite conductor width is:

(1) place outer arc in a place which produces no net gradient at the origin;

(2) calculate the second (third) derivative produced by the outer arc at this position (e.g., in design of x-gradient coils);

(3) arrange the inner arc so as to cancel that derivative; and (4) calculate the resulting transverse gradient.

All of this assumes a certain width for each of the conductors and a certain radius. The following calculations will use typical values of 10 turns at 0.45 inch for the wire width and inner/outer radius r of 15.175 inches and 15.83 inches.

(1) Zeroing the Net Gradient

The gradient from an arc at z is:

$$G = \frac{\mu_0 I}{\pi} (2r \sin \phi) \left\{ \frac{2r^2 - z^2}{(r^2 + z^2)^{5/2}} \right\}$$ [Equation 17]

For a distribution from $z_0 - Sz/2$ to $z_0 + SZ/2$ is:

$$G = \frac{\mu_0 I}{\pi w} (2r \sin \phi) \int_{z_0 - \frac{\delta z}{2}}^{z_0 + \frac{\delta z}{2}} \frac{2r^2 - z^2}{(r^2 + z^2)^{5/2}} dz$$ [Equation 18]

w = width of conductor let z=rtanv. The integral is therefore:

$$\int \frac{1}{r^2} \frac{2 - \tan^2 v}{\sec^5 v} \sec^2 v dv$$ [Equation 19]

$$= \frac{1}{r^2} \int [2(1 - \sin^2 v) - \sin^2 v] d(\sin v)$$ [Equation 20]

$$= \frac{1}{r^2} (2 \sin v - \sin^3 v)$$ [Equation 21]

$$= \frac{2r^2 z + 2z^3 - z^3}{(r^2 + z^2)^{3/2}}$$ [Equation 22]

$$G = \frac{\mu_0}{\pi} \left( \frac{I}{\omega} \right) (2r \sin \phi) \frac{2r^2 z + z^3}{r^2(r^2 + z^2)^{3/2}} \bigg|_{z_0 - \frac{\delta z}{2}}^{z_0 + \frac{\delta z}{2}}$$ [Equation 23]

Solving for G=0.

TABLE 1

| $\frac{\delta z}{r}$ | $\frac{z}{r}$ | $\frac{\delta z}{r}$ | $\frac{z}{r}$ |
|---|---|---|---|
| .01 | 1.414 | .6 | 1.472 |
| .1 | 1.416 | .7 | 1.492 |
| .2 | 1.421 | .8 | 1.515 |
| .3 | 1.429 | .9 | 1.540 |
| .4 | 1.441 | 1.0 | 1.567 |
| .5 | 1.455 | | |

(2) Calculating the second derivative contribution

The net first (second) derivative vanishes by symmetry.

The first one to sorry about is therefore the second (third) derivative. The integral of this is:

$$\int_{z_0 - \frac{\delta z}{2}}^{z_0 + \frac{\delta z}{2}} \frac{\partial^2}{\partial z^2} \left( \frac{\partial}{\partial x} B_z \right) dz =$$ [Equation 24]

-continued $$\frac{\partial}{\partial z}\left(\frac{\partial}{\partial x}B_z\right)\Bigg|_{z0-\frac{\delta z}{2}}^{z0+\frac{\delta z}{2}}$$

(where the derivative is the term from just one loop).

First, we need to evaluate the derivative for the outer arcs:

TABLE 2

| $\frac{\delta z}{r}$ | $\frac{\partial^2}{\partial z^2}\left(\frac{\partial}{\partial x}B_z\right)$ |
|---|---|
| .3 | 0.2129 |
| .28 | 0.2041 |

(3) Cancellation Placement of the Inner Arc

TABLE 3

| $\frac{\partial z}{r}$ | $\frac{z}{r}$ |
|---|---|
| .3 | 0.374 |
| .28 | 0.3784 |

(4) Calculating the Gradient strength (produced by inner arcs)

TABLE 4

| $\frac{\delta z}{r}$ | $\frac{z}{r}$ | G |
|---|---|---|
| .3 | .3794 | 0.3928 |
| .28 | .3784 | 0.3773 |

Actual gradients are:

at .3 $G = \frac{.918}{r^2}$ Gauss/amp-cm  [Equation 25]

at .28 $G = \frac{.920}{r^2}$ Gauss/amp-cm  [Equation 26]

Since magnetic flux created by the transverse gradient coils cannot penetrate superconductor solenoid 10, the gradient fields are necessarily distorted so as to be contained within solenoid 10 and eddy currents are generated in a surrounding conductive sheet. Such eddy currents also represent energy losses and also require that each switched input pulse of drive current to the gradient coils be temporarily increased so as to compensate for these eddy currents. Thus, for several reasons, it is desirable to minimize such required eddy current compensation—while also reducing the coil self-inductance and the fraction of total driving current required to supply such "overdrive" compensation. Assuming that the compensated driving pulse includes four superimposed exponential terms having associated magnitudes and time constants TC1, TC2, TC3, TC4, the following tables show, for one exemplary embodiment having compacted x-gradient and y-gradient coils, the kind of improvement that may be achieved:

TABLE 5

| Compensation Component | Transverse Gradient Coils Original Size | | | Transverse Gradient Coils Compact Size | | |
|---|---|---|---|---|---|---|
| | Abs. Magnitude | Drive Fraction | Time Constant | Abs. Magnitude | Drive Fraction | Time Constant |
| X-Gradient Coils | | | | | | |
| TC1 | .104 | .19 | 325 ms | .047 | .08 | 406 ms |
| TC2 | .064 | .12 | 50 ms | .122 | .20 | 23 ms |
| TC3 | 0 | 0 | n/a | .017 | .03 | 0.88 ms |
| TC4 | .14 | .25 | 20 ms | .008 | .01 | 8 ms |
| Total Overdrive | | .56 | | | .31 | |
| Y-Gradient Coils | | | | | | |
| TC1 | .108 | .19 | 370 ms | .056 | .09 | 370 ms |
| TC2 | .08 | .14 | 3.25ms | .047 | .08 | 40 ms |
| TC3 | 0 | 0 | n/a | .023 | .04 | 56 ms |
| TC4 | .055 | .09 | 15 ms | .055 | .09 | 15 ms |
| Total Overdrive | | .42 | | | .30 | |
| Z-Gradient Coils | | | | | | |
| TC1 | .13 | .29 | 495 ms | .10 | .23 | 452 ms |
| TC2 | .10 | .22 | 40 ms | .132 | .30 | .45 ms |
| TC3 | 0 | 0 | n/a | .089 | .20 | .45 ms |
| TC4 | .156 | .35 | 15.5 ms | .088 | .20 | 14 ms |
| Total Overdrive | | .86 | | | .92 | |

Measured gradient coil self-inductances for this same exemplary embodiment are also shown below in Table 6:

TABLE 6

| Gradient Coil Self Inductances | | | | |
|---|---|---|---|---|
| | Original Size | | Compact Size | |
| | One End | Both Ends | One End | Both Ends |
| In Static Magnet | | | | |
| X Grad | 232 mH | 470 mH | 171 mH | 360 mH |
| Y Grad | 245 mH | 500 mH | 167 mH | 352 mH |
| Z Grad | 310 mH | 590 mH | 270 mH | 546 mH |
| Outside Static Magnet | | | | |
| X Grad | 301 mH | | 215 mH | |
| Y Grad | 315 mH | | 203 mH | |
| Z Grad | 411 mH | | 413 mH | |

While only a few exemplary embodiments of this invention have been described in detail, those skilled in the art will recognize that many variations and modifications may be made while still retaining many of the novel features and advantages of this invention. Accordingly, all such modifications and variations are intended to be included within the scope of the appended claims.

What is claimed is:

1. A compact transverse magnetic gradient coil structure for use in a magnetic resonance in aging system having a static magnetic field $H_o$ directed along a predetermined z-axis, said coil structure comprising:

an outer arc located so as to produce negligible net transverse gradient in $H_o$ at a predetermined observation point along the z-axis; and an inner arc located so as to produce a second derivative of the transverse gradient which substantially cancels the second derivative produced by the outer arc at said predetermined observation point.

2. A compact transverse magnetic gradient saddle coil structure for use in a magnetic resonance imaging system having a static magnetic field $H_o$ directed along a predetermined z-axis, said saddle coil structure comprising:

an inner arc of radius $r_1$ located at a first distance $z_1$ from a predetermined point $z_o$ on the z-axis, and an outer arc of radius $r_2$ located at a second distance $z_2$ from $z_o$, $z_2/r_2$ being substantially less than 2.57.

3. A compact transverse magnetic gradient saddle coil structure for use in a magnetic resonance imaging system having a static magnetic field $H_o$ directed along a predetermined z-axis, said saddle coil structure comprising:

an inner arc of radius $r_1$ located at a first distance $z_1$ from a predetermined point $z_o$ on the z-axis, $z_1/r_1$ being greater than 0.389; and an outer arc of radius $r_2$ located at a second distance $z_2$ from $z_o$, $z_2/r_2$ substantially less than 2.57.

4. A compact transverse magnetic gradient saddle coil structure as in claim 3 wherein $z_1/r_r$ is approximately equal to 0.45 and $z_2/r$ is approximately equal to 1.4.

5. A transverse gradient coil structure for creating a transverse gradient in the static magnetic field $H_o$ of a magnetic resonance imaging system, said coil structure comprising:

a first set of opposingly directed partial turns having radius $r_1$ and located at a first distance $z_1$ from a predetermined observation point, $z_1/r_1$ being greater than about 0.389; and a second set of opposingly directed partial turns having radius $r_2$ and located at a second distance $z_2$ from said predetermined observation point, $z_2/r_2$ being substantially less than about 2.57.

6. A transverse gradient coil structure as in claim 5 further comprising:

a symmetrical further first set of opposingly directed partial turns located at a distance $-z_1$ on the opposite side of said observation point; and a symmetrical further second set of opposingly directed partial turns located at a distance $-z_2$ also on the opposite side of said observation point.

7. A transverse gradient coil structure as in claim 6 wherein $r_1 = r_2$.

8. A transverse gradient coil structure as in claim 6 wherein each of the sets of partial turns includes plural partial turns directed in a clockwise sense and plural partial turns directed in a counter clockwise sense, said partial turns in said first and second sets being connected together by horizontal parallel conductors.

9. A transverse gradient coil structure as in claim 5, 6, or 7 wherein each of said partial turns is formed into an approximately circular arc subtending an angle of about 120° and with its axis aligned with said static magnetic field.

10. A transverse gradient coil structure as in claim 9 wherein:

$z_2/r_2$ is approximately equal to 1.4 and $z_1/r_1$ is approximately equal to 0.45.

said first and second sets thereby producing approximately equal second derivatives with respect to z of the transverse gradient field at said observation point.

11. A magnetic coil assembly for use in magnetic resonance imaging, said coil assembly comprising:

a static field coil producing a static $H_o$ field directed along a z-axis;

z-gradient coils disposed symmetrically about a predetermined observation point on said z-axis for producing a gradient in said static field in the z-axis direction;

y-gradient coils disposed symmetrically about said observation point for producing a gradient in said static field in a y-axis direction orthogonal to said z-axis direction, and x-gradient coils, disposed symmetrically about said observation point for producing a gradient in said static field in an x-axis direction orthogonal to both said z-axis and y-axis directions;

each of said y-gradient and x-gradient coils including first and second saddle coil pairs disposed symmetrically on either side of said observation point, each of said saddle coil pairs including a plurality of partial arcuate turns of radius r subtending an angle of about 120 degrees centered about said z-axis and connected together in series by horizontal conductors approximately parallel to the z-axis;

said partial arcuate turns being situated in a first axially aligned group disposed at a distance $z_1$ from said observation point and a second axially aligned group disposed at a distance $z_2$ from said observation point, said distance $z_2/r$ for being substantially less than 2.57 and yet sufficiently large so as to produce negligible contribution to the transverse gradient at said observation point; and said distance $z_1/r$ being sufficiently greater than 0.389 so as to produce a second derivative of the first group's transverse magnetic gradient with respect to z which approximately equals in magnitude the second derivative of the second group's transverse magnetic gradient with respect to z.

12. A method for dimensioning a compact transverse magnetic gradient saddle coil to be used in a magnetic resonance imaging system having a static magnetic field $H_o$ directed along a predetermined z-axis which is mutually orthogonal with predetermined x and y axes, said method comprising the steps of:

locating an outer arc of the saddle coil so as to produce only negligible net transverse gradient in $H_o$ at a predetermined observation point along the z-axis;

determining the magnitude of the second derivative of the transverse gradient produced by said outer arc at said predetermined observation point; and locating an inner arc of the saddle coil so as to produce a second derivative of the transverse gradient which substantially cancels that of the outer arc at said predetermined observation point.

* * * * *

UNITED STATES PATENT AND TRADEMARK OFFICE
CERTIFICATE OF CORRECTION

PATENT NO. : 4,755,755
DATED : JULY 5, 1988
INVENTOR(S) : CARLSON

It is certified that error appears in the above-identified patent and that said Letters Patent is hereby corrected as shown below:

Column 2 line 68 delete "$z_2 \sqrt{r=2}$" and replace by -- $z_2/r = \sqrt{2}$ --
Column 5 line 20 add a parenthesis -- { -- before "$I_K r^2$"
Column 5 line 42 delete "$R \sin \Theta \cos \tau,$" and replace by
-- $R \sin \Theta \cos \xi,$ --
Column 5 line 63 on right side of minus sign of the equation delete "$z_1^2$" and replace by -- $z_2^2$ --
Column 6 line 51 delete "$z_1 0.389r$" and replace by
-- $z_1 = 0.389r$ --
Column 6 line 68 delete "$z_2 = \sqrt{2}$" and replace by -- $z_2 = \sqrt{2r}$ --
Column 7 line 50 delete "$z_2 = the \sqrt{2r}$" and replace by
-- $z_2 = \sqrt{2r}$ --

Signed and Sealed this

Twenty-seventh Day of December, 1988

*Attest:*

DONALD J. QUIGG

*Attesting Officer*   *Commissioner of Patents and Trademarks*